United States Patent [19]

Doche

[11] Patent Number: 5,549,205
[45] Date of Patent: Aug. 27, 1996

[54] FLAT BOX FOR CONFINING A FLAT ARTICLE UNDER A SPECIAL ATMOSPHERE

[75] Inventor: Claude Doche, Claix, France

[73] Assignee: Commissariat a l'Energie Atomique, France

[21] Appl. No.: 385,065

[22] Filed: Feb. 7, 1995

Related U.S. Application Data

[63] Continuation of Ser. No. 131,090, Oct. 1, 1993, abandoned.

[30] Foreign Application Priority Data

Oct. 16, 1992 [FR] France ................. 92 12423

[51] Int. Cl.⁶ .................... B65D 81/05; B65D 81/20
[52] U.S. Cl. .................. 206/710; 206/723; 206/213.1
[58] Field of Search ............... 211/41; 118/500; 414/935, 939; 206/328, 334, 454, 524.4, 524.8, 710, 711, 712, 722, 723, 213.1

[56] References Cited

U.S. PATENT DOCUMENTS

| | | | |
|---|---|---|---|
| 4,422,547 | 12/1983 | Abe et al. | 206/454 X |
| 4,585,122 | 4/1986 | Stegenga | 206/334 |
| 4,886,162 | 12/1989 | Ambrogio | 206/454 X |
| 5,074,736 | 12/1991 | Ishii | 206/454 X |

FOREIGN PATENT DOCUMENTS

| | | |
|---|---|---|
| 0246587 | 5/1987 | European Pat. Off. . |
| 0273791 | 11/1987 | European Pat. Off. . |
| 9202950 | 2/1992 | WIPO . |

*Primary Examiner*—Jacob K. Ackun
*Attorney, Agent, or Firm*—Hayes, Soloway, Hennessey, Grossman & Hage, P.C.

[57] ABSTRACT

A box is provided for confining a semiconductor water in an ultra clean atmosphere between working or storage points. It is mainly constituted by a body closed by a door and equipped with a gas distributing block making it possible to diffuse a quasi-laminar flow around the article within the body.

13 Claims, 2 Drawing Sheets

FLAT BOX FOR CONFINING A FLAT ARTICLE UNDER A SPECIAL ATMOSPHERE

This is a continuation of application Ser. No. 08/131,090 filed on Oct. 1, 1993 and now abandoned.

FIELD OF THE INVENTION

The invention relates to the storage and transportation of flat articles or objects under a special atmosphere, particularly during their manufacture, treatment or processing. The invention more particularly applies to silicon wafers confined in an ultraclean atmosphere. These silicon wafers or disks are used for the manufacture of integrated circuits in the electronics and microelectronics fields. However, the invention can apply to any random flat article to be individually stored in a flat or shallow box or case.

PRIOR ART AND SET PROBLEM

In connection with the manufacture of electronic circuits on circular silicon wafers or disks, the various operations are carried out at working stations under a ultraclean atmosphere. Under these conditions, the internal volume of said working stations must be constantly exposed to the ultraclean atmosphere. This also applies with respect to the volumes within which the articles move between the working stations.

Thus, rooms known as white rooms are known, whose atmosphere is maintained at a very high cleanness level. It is also known to confine flat articles during their transportation between two working stations in special containers or tunnels, whose internal volumes are constantly ventilated with the ultraclean atmosphere in question.

It is clear that these installations making it possible to confine flat articles between two working stations under an ultraclean atmosphere are therefore sophisticated and onerous. This applies to an even greater degree with respect to the white rooms.

The object of the invention is to obviate these disadvantages by avoiding the use of installations involving a confinement under an ultraclean atmosphere of flat articles during their storage and transportation between different working stations.

SUMMARY OF THE INVENTION

In accordance with the concept based on reducing to a minimum the ultraclean atmosphere volume surrounding each article, the invention relates to a flat box for confining a flat article under a special atmosphere. It comprises a flat body having an opening for the introduction of the object.

According to the invention, said opening is located on a lateral face of the box, which is horizontal, said box having a lateral door to be positioned facing the lateral opening of the body, lateral, internal means for holding the article, which must not touch the upper and inner lower walls of the box and an aeraulic or so-called gas block placed on a second lateral face of the body opposite to the first lateral face and facing a second opening of the body, said block being connectable to a special atmosphere supply means, in order to distribute within the body through the second opening the special atmosphere, including the vacuum.

According to the preferred embodiment of the invention the internal cross-section of the box is a horizontal ellipse and the lateral, internal means for retaining or holding the article are constituted by the tips of the major axis of the ellipse.

As a function of the different flat article treatment systems, the box has an anchoring system on the aeraulic block to permit the fixing of the latter to a handling member for the treatment system.

Within the scope of the data processing control of the treatment of the articles contained in the boxes, it is advantageous for each box to have a data processing card on its aeraulic block, whereby said card can be activated for reading and writing informations carried by the box and relating to the article contained therein.

Preferably, the box has a door opening and closing system. The latter can be a locking system of the lever capping type, whereof a horizontal manipulating bar projects beyond the body of the box in order to permit the actuation of the opening and closing system.

It is preferable to use an internal jaw fixed to the inner face of the door in order to lock the object.

With a view to transferring the object or article contained in the box into a work station, which is itself under a special atmosphere, according to the invention the box has a catch or ratchet system placed on the outer face of the door, in order to link the box door with a door of the work station, into which the object in the box is to be introduced.

According to the preferred embodiment of the box each of the openings is located over the entire lateral face thereof and the aeraulic block has a diffuser located over the entire length of the second opening in order to diffuse into the box a gas constituting the special atmosphere in the form of a quasi-laminar flow.

The diffuser can be a regularly perforated wall, such as a grating or grid. The form of the diffuser is chosen so as to ensure a rear locking of the article.

In another embodiment, the diffuser can be in the form of a detachable, interchangeable, filtering and semi-rigid envelope surrounding the article, which makes it possible to diffuse the special atmosphere around the article and which has a lateral opening for the introduction of the article.

This filtering envelope is preferably elastic and is fixed to the door in order to ensure the locking of the article against the inner face of the door and the access to the article by a terminal finger of a pick and place-type robot.

DESCRIPTION OF THE DRAWINGS

The invention is described in greater detail hereinafter relative to a non-limitative embodiment and the attached drawings, wherein show.

DETAILED DESCRIPTION OF AN EMBODIMENT OF THE INVENTION

The present invention e.g. relates to an application to the manufacture of integrated circuits on silicon wafers or disks, but could also relate to the manufacture of flat-faced screens.

Figure 1:
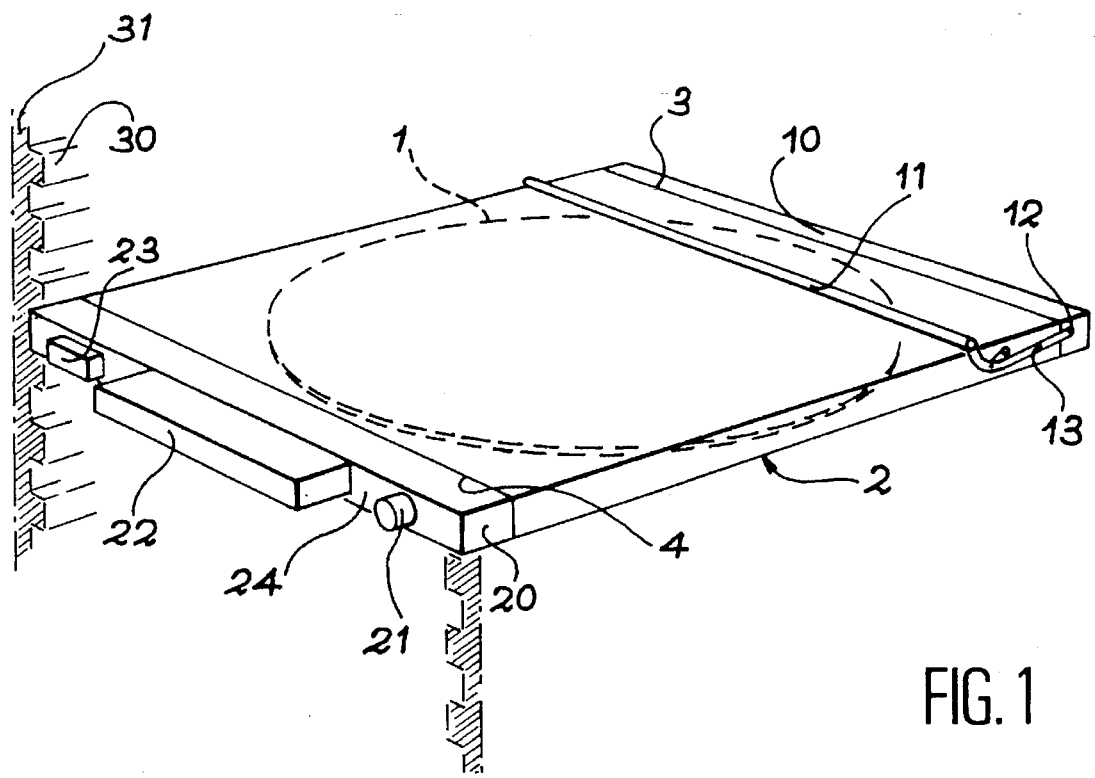
FIG. 1 The box according to the invention placed in a storage rack.

With reference to FIG. 1, the box according to the invention has a square or rectangular, flat shape with a limited thickness. It is intended to contain an object or article, such as a silicon wafer or disk 1. Therefore the box mainly comprises a body 2 within which is placed the article 1. This body can be made from a plastics material or metal. It is preferably constituted by a section, whose shape and ribs ensure a good rigidity.

Another essential part of the box is the door 10 which closes the body 2 on a first opening of the first lateral face 3 of the body 2, preferably over the entire length of said lateral face. The opening and closing of the door 10 is ensured by a locking and unlocking device, symbolized in FIG. 1 by a transverse manipulating bar 11 mounted so as to pivot about a horizontal spindle 12 traversing the door by means of two levers 13.

According to the invention, the third main part of the box is an aeraulic block 20 positioned opposite the door 10 on a second lateral face 4 of the body 2, preferably over the entire length of said second lateral face 4. The function of the aeraulic block 20 is to distribute within the volume of the body 2 a flow of air, gas or special atmosphere, so that the silicon wafer 1 is surrounded by said air flow. The latter can also be used for scavenging the inner walls of the body 2. To this end, the aeraulic block 20 has an aeraulic intake 21 supplying the special atmosphere to the block 20. It is pointed out that said special atmosphere can be an ultraclean gas or nitrogen. The aeraulic block 20 also preferably has an anchoring system 22 located outside the seine so as to permit the anchoring of the box to an appropriate handling member.

The aeraulic block 20 can be completed by a data processing card 23 placed on the outer face 24 of the block 20. This data processing card 23 is arranged in such a way that it can be activated at any time. It is therefore possible to read and write informations on said card concerning in preferred manner the article 1 contained in the box body 2 and in particular informations concerning its treatment, processing and manufacture, as well as the work stations which the silicon wafer 1 has already traversed and/or has yet to traverse.

The box is shown on a rack member 31 of a storage or transportation rack 30. Therefore such a rack 30 can have means for connecting to the data processing card 23.

Figure 2:
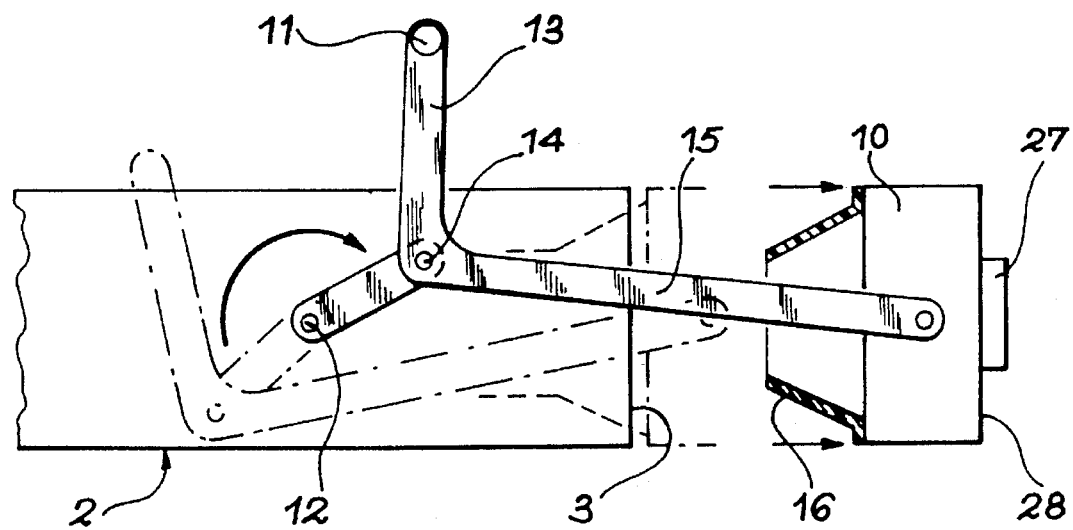
FIG. 2 In section, the opening and closing mechanism for the door of the box according to the invention.

With reference to FIG. 2, a preferred embodiment of the opening and closing system for the door 10 is in the form of a lever capping device, like those used for sealing lemonade bottles. It is mainly constituted by the transverse bar 11 kept outside the body 2 by means of two levers 13. Thus, the assembly is mounted so as to pivot about the horizontal spindle 12. A rotation by 180° of the assembly of the two levers 13 and the bar 11 permits a rotation of an articulation point 14 placed on the levers 13, whereas two carrying levers 15 laterally hold the door 10, facing the first lateral face 3 of the body 2.

Thus, a complete rotation makes it possible to pass said articulation point 14 beyond a point permitting the maximum drawing of the door 10 against the body 2. Beyond said position, the door 10 is locked against the body 2. The transverse bar 11 is mounted so as to be constantly outside the body 2. A joint 16 can be mounted on the inner face of the door 10 in order to ensure a complete seal with the body 2.

Figure 3:
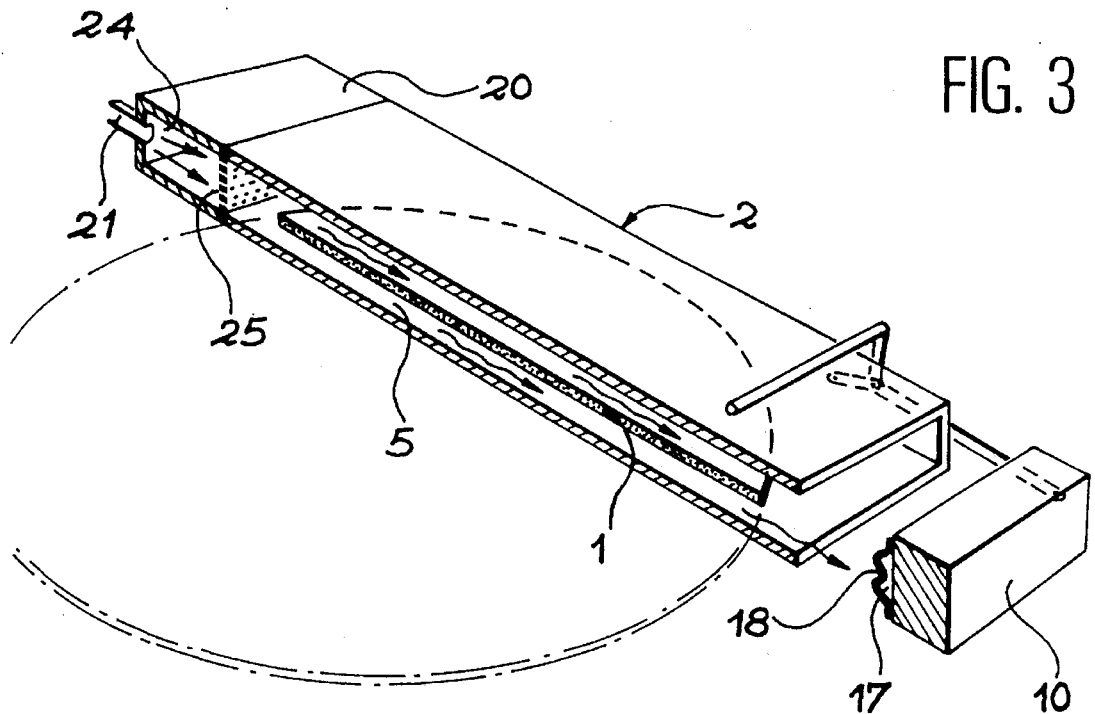
FIG. 3 In section, a first embodiment of the interior of the box according to the invention.

In FIG. 3, which shows in section the interior of the box body 2, it is possible to see on the inner face of the door 10 an inner jaw 17 having a slight central cavity 18. This inner jaw 17 maintains the silicon wafer 1 within the body 2 during the closing of the door 10.

On the other side of FIG. 3, it is possible to see the aeraulic block 20, as well as its aeraulic intake 21 issuing into the interior of an internal volume 24. The aeraulic block 20 is completed by the special atmosphere diffuser.

A first embodiment of the diffuser shown in FIG. 3 has a perforated plate 25 in the manner of a grid. Thus, the air arriving by means of the aeraulic intake 20 within the inner volume 24 of the aeraulic block 20 is diffused within the internal volume 5 of the body 2.

Such a clean air or nitrogen flow can therefore surround the article 1 contained within a box, namely a silicon wafer. The speed and rate of the gas distributed within the volume 5 are such that a laminar or quasi-laminar flow is obtained within the volume 5, so that the silicon wafer 2 is regularly scavenged in turbulence-free manner. The perforated plate 25 can have a shape making it possible to lock the article 1. Thus, if said shape is complimentary to the circular shape of the article 1, the perforated plate 25 can contribute to the securing of the article within the body 2.

Figure 4:
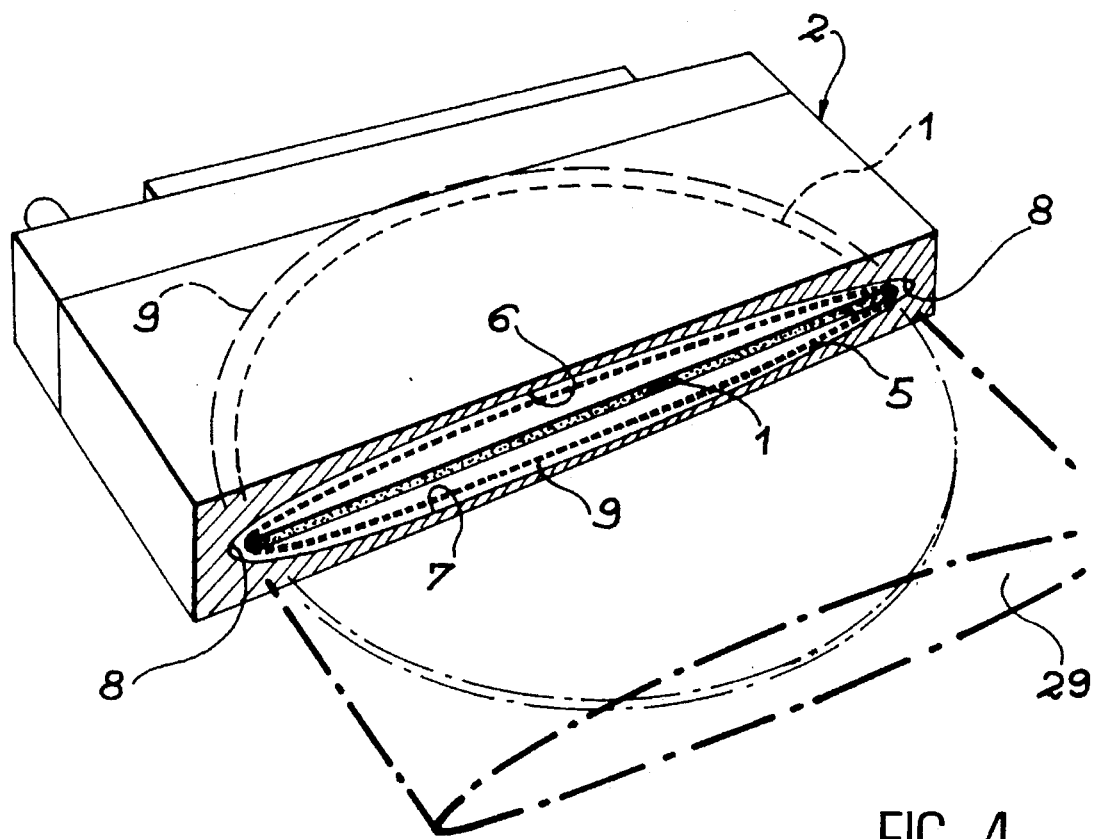
FIG. 4 In section, a second embodiment of the interior of the box according to the invention.

According to FIG. 4, which shows the internal volume 5 of the body 2, a main characteristic of the box according to the invention is that the inner body has lateral means for holding the article 1. Thus, the latter is maintained within the body 2 without touching the upper 6 and lower 7 surfaces of the body 2. Thus, the air flow formed by the diffuser 25 of FIG. 3 can completely surround the two faces of the silicon wafer 2 and thus ensure its aeraulic scavenging.

The embodiment shown in FIG. 4 reveals that the cross-section of the internal volume 5 of the body 2 can be an ellipse, whereof the tips 8 of the major ellipse axis in each case constitute a rack member for holding the silicon wafer 1. The space between said silicon wafer 1 and the upper 6 and lower 7 surfaces of the internal volume 5 of the body 2 must be adequate to ensure that the flow is quasi-laminar and so that a terminal finger of a robot can come below the wafer 1 in order to grasp the latter. For such operations a pick and place robot is suitable and it is compatible with such a box according to the invention.

The broken lines in FIG. 4 indicate an envelope 9 surrounding the silicon wafer 1. This envelope 9 has an opening 29 corresponding to that of the first lateral face of the body 2 and is fixed around the latter. The rear portion of the envelope 39 adopts the shape of the silicon wafer 1.

Such a filtering envelope 9 is detachable, i.e. interchangeable. It is also semi-rigid and elastic, so as to constantly apply the wafer 1 to the door 10. Thus, during the closing of the door 10 against the body 2, the envelope 9 tends to push the silicon wafer 1 against the door 11 and more specifically into the cavity 18 of the jaw 17 of the door 10. Thus, the silicon wafer 1 is longitudinally secured.

This filtering envelope 9 also makes it possible to diffuse ultraclean air or nitrogen from the aeraulic block 20 around the silicon wafer 1. The first embodiment of the diffuser in the form of a perforated wall 25 is therefore eliminated, the filtering envelope fulfilling this function of the homogeneous diffusion of the ultraclean air or nitrogen around the two faces of the silicon wafer 1. This leads to a tight box confining the wafer 1 in an environment appropriate for its treatment or manufacture.

It is also possible to have within the box different pressures, such as a slight overpressure in order to ensure the protection during transportation and storage of the silicon wafer 1. In the same way, a partial vacuum can be obtained within the box, if sealing joints are placed between the door 10 and the body 2 and between the body 2 and the aeraulic block 20.

Thus, the box according to the invention can become active, i.e. the internal volume 5 of the body 2 is scavenged by the ultraclean air flow by means of the aeraulic block 20. Thus, although the door 10 is open, the silicon wafer 1 is protected against the possibly contaminating atmosphere. The inner walls of the inner volume 5 of the body 2 are also protected. It is therefore possible to open the door in order to grasp the silicon wafer 1 and introduce it into a work station. To this end, a mechanical catch system 27 is provided on the outer wall 28 of the door 10 in order to join the box to the door of an external system, namely a work station. Therefore the box can be opened jointly with the opening of the work station and the confinement atmosphere of the silicon wafer 1 blown in by the aeraulic block 20 can be the same as that prevailing within the work station. This also applies during the reintroduction into the box of the wafer 1 following its treatment in the work station.

Obviously the invention can have applications other than to integrated circuits. It can relate to any treatment or manipulation of flat articles in a controlled atmosphere or under a vacuum.

I claim:

1. A flat transfer box for the confinement of a semiconductor wafer under a special protective atmosphere as it is transferred between one wafer processing machine and another separate wafer processing machine in a clean room, said wafer transfer box comprising a thin, flat body defining an internal volume and having upper and lower walls and at least two sealed lateral faces extending along opposite edges of the body, said box further comprising, lateral means for supporting the wafer so that the wafer does not contact either said upper or lower walls, a lateral door positioned facing an opening in a third lateral face of the body, said door being arranged to be opened to permit introduction of the wafer into the box from a first wafer processing machine and removal of the wafer from the box for introduction of the wafer into a second wafer processing machine, and a gas distributing block placed in an opening of a fourth lateral face of the body opposite to the third face and adapted to be connected to a special atmosphere supply in order to distribute the special atmosphere within the body by means of the second opening and to provide flow of said special atmosphere from said third face to said fourth face and into each said wafer processing machine, said four lateral faces combining with said upper and lower walls to provide a completely sealed transfer box which protects the wafer from clean room atmosphere.

2. Box according to claim 1, characterized in that an internal cross-section of the internal volume of the body is a horizontal ellipse, the latera means for holding the article being constituted by the tips of the major axis of the ellipse.

3. Box according to claim 1, characterized in that it comprises an anchoring system fixed to the gas distributing block to permit the fixing of the box to an external handling member.

4. Box according to claim 1, characterized in that it comprises a data processing card fixed to the outer surface of the gas distributing block and which can be activated for the reading and writing of informations carried by the box and relative to the object contained therein.

5. Box according to claim 1, characterized in that it comprises an opening and closing system for opening and closing the door.

6. Box according to claim 5, characterized in that the opening and closing system is of the lever capping type, whereof a horizontal manipulating bar projects beyond the body to permit its actuation.

7. Box according to claim 1, characterized in that it comprises an inner jaw fixed to an inner face of the door in order to longitudinally lock the article.

8. Box according to claim 1, characterized in that it comprises a catch system placed on an outer face of the door in order to join the box door (10) to a door of an external system into which a semiconductor wafer contained in the box has to be introduced.

9. Box according to claim 1, characterized in that each of the openings in the third and fourth lateral faces of the body extend over the entire corresponding lateral face thereof, and the gas distributing block has a diffuser placed through-out it's associates opening in order to diffuse a quasi-laminar flow of a gas constituting the special atmosphere into the body.

10. Box according to claim 9, characterized in that the diffuser is constituted by a perforated wall.

11. Box according to claim 10, characterized in that the perforated wall has a shape chosen so as to ensure the locking of the article.

12. Box according to claim 1, comprising a diffuser in the form of a semi-rigid, interchangeable, detachable, filtering envelope for surrounding a semiconductor wafer and having a lateral opening for the introduction of the semiconductor wafer and making it possible to diffuse the atmosphere around the semiconductor wafer.

13. Box according to claim 12, characterized in that the filtering envelope is elastic and is fixed to the door in order to longitudinally lock the article against an inner face of the door and provide access to the article by a terminal finger of a pick and place robot.

* * * * *

UNITED STATES PATENT AND TRADEMARK OFFICE
CERTIFICATE OF CORRECTION

PATENT NO.    :  5,549,205
DATED         :  August 27, 1996
INVENTOR(S)   :  Claude Doche It is certified that error appears in the above-indentified patent and that said Letters Patent is hereby corrected as shown below:

Claim 2, Col. 5, line 50, "latera" should be --lateral--.

Claim 9, Col. 6, line 30, "associates" should be --associated--.

Signed and Sealed this

Twelfth Day of November, 1996

Attest:

BRUCE LEHMAN

Attesting Officer    Commissioner of Patents and Trademarks